United States Patent [19]
Smith

[11] Patent Number: 5,250,844
[45] Date of Patent: Oct. 5, 1993

[54] MULTIPLE POWER/GROUND PLANES FOR TAB

[75] Inventor: Brenda K. Smith, Scottsdale, Ariz.

[73] Assignee: Motorola, Inc., Schaumburg, Ill.

[21] Appl. No.: 960,181

[22] Filed: Oct. 9, 1992

Related U.S. Application Data

[63] Continuation of Ser. No. 583,403, Sep. 17, 1990, abandoned.

[51] Int. Cl.$^5$ .............................................. H01L 23/48
[52] U.S. Cl. ................................. 257/695; 357/695; 357/900; 357/748; 357/752
[58] Field of Search ............... 357/70, 71; 251/659, 251/660, 695, 698, 700, 748, 752

[56] References Cited
U.S. PATENT DOCUMENTS
4,417,266 11/1983 Grabbe .................................. 357/70
4,933,741 6/1992 Schroeder ............................ 357/70

FOREIGN PATENT DOCUMENTS
0312975 10/1988 European Pat. Off. .

Primary Examiner—Robert J. Pascal
Assistant Examiner—R. A. Ratliff
Attorney, Agent, or Firm—Joe E. Barbee

[57] ABSTRACT

A TAB lead frame having concentric power/ground planes provides for even distribution of power and ground potentials about the periphery of an integrated circuit. An electrically conductive plane is divided into multiple concentric power/ground planes, each of which are electrically isolated from each other and from the leads of the TAB lead frame. A dielectric layer electrically isolates the concentric power/ground planes from the leads. Electrical connection between the power/ground planes and the leads is made as appropriate via holes through the dielectric layer. The concentric planes provide structural strength to the TAB lead frame, while the even power distribution provides consistent shielding for each lead of the lead frame, and provides flexibility as to the placement of connector pads on the integrated circuit.

5 Claims, 2 Drawing Sheets

MULTIPLE POWER/GROUND PLANES FOR TAB

This application is a continuation of prior application Ser. No. 07/583,403 now abandoned, filed Sep. 17, 1990.

BACKGROUND OF THE INVENTION

The present invention relates, in general, to tape automated bonding lead frames, and more particularly to a tape automated bonding lead frame which provides for multiple power and ground planes located in a single plane, arranged concentrically about an integrated circuit bonded to the lead frame.

With a steady increase in the number and density of leads required for semiconductor devices, tape automated bonding (TAB) has become the technology of choice for many high density applications. Among the problems to be overcome as leads become more and more densely packed are those related to capacitive coupling and lead impedance. In the past, these problems were addressed by the addition of a ground plane located parallel to, but electrically isolated from the plane of the TAB leads. In many applications, however, it was necessary to isolate high current ground lines connected to devices which were switching on and off from low current ground lines which showed less fluctuation in current levels. Failure to make such an isolation could, for instance, introduce noise from a power output back into a signal input, yielding an unacceptable signal to noise ratio.

Multiple power and ground planes represented an expensive solution to the problem. Dividing a single ground plane into radial sections was an effective approach in many ways, but also had some shortcomings. First, the electrical field which each lead saw was different, depending upon the potential on the nearest power/ground plane segment. Thus the shielding each lead saw was different. Also, in many applications multiple connections to the same power or ground potential were required, but were not co-located upon the semiconductor device. The same ground potential was required on two or more different sides of the semiconductor device. Multiple connections to a single power potential were likewise required. Such connections were not always easily made with the radially segmented ground plane.

SUMMARY OF THE INVENTION

The objectives and advantages of the present invention are provided by a TAB lead frame having concentric power/ground planes which provide for even distribution of power and ground potentials about the periphery of a semiconductor device bonded to the TAB lead frame, while providing structural strength to the TAB lead frame. An electrically conductive plane is divided into multiple concentric power/ground planes, each of which are electrically isolated from each other and from the leads of the TAB lead frame. A dielectric layer electrically isolates the concentric power/ground planes from the leads. Electrical connection between the power/ground planes and the leads is made as appropriate via holes through the dielectric layer.

DETAILED DESCRIPTION OF THE DRAWINGS

Figure 1:
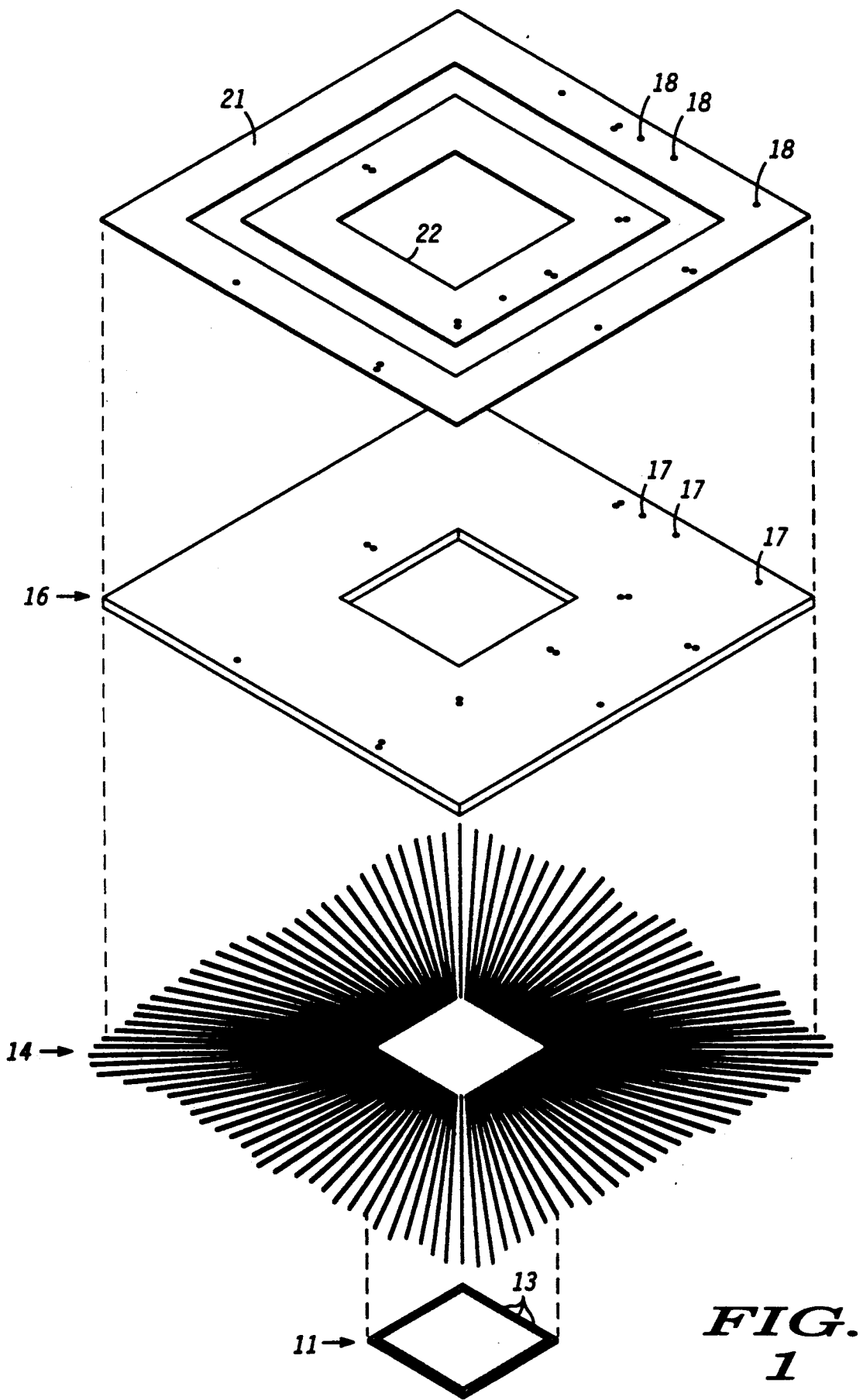
FIG. 1 is an exploded view illustrating an embodiment of the present invention.

FIG. 1 depicts a lead frame assembly by which a semiconductor device such as integrated circuit 11 is bonded to a lead frame using TAB technology to provide electrical functionality to integrated circuit 11. Integrated circuit 11 has connector pads 13 located about its periphery for providing power, ground, input, and output connections for integrated circuit 11. Leads 14 of a TAB lead frame bond to connector pads 13, by which electrical signals and potentials are coupled to integrated circuit 11. Capacitive coupling and crosstalk as well as lead impedance among leads 14 can be minimized by shielding leads 14 with power/ground planes. In the case of FIG. 1, two concentric power/ground planes 21 and 22 are utilized. Power/ground planes 21 and 22 are electrically isolated from each other, power/ground plane 22 being wholly contained within the inner perimeter of power/ground plane 21. Power/ground planes 21 and 22 are electrically isolated from leads 14 by dielectric layer 16. Power/ground planes 21 and 22 can perform a variety of functions, depending upon the requirements of various applications. One common application is the isolation of power ground, or noisy ground, from signal ground, or quiet ground. This prevents noise at the outputs of integrated circuit 11 from feeding back through the ground lines to the inputs of integrated circuit 11. The result is an improvement in the input signal-to-noise ratio. The two ground planes are electrically coupled at some point in the system, away from integrated circuit 11. Another common configuration is to have plane 21, for example, be a power plane, while plane 22 is a ground plane. Another possible configuration makes both planes 21 and 22 power planes with different power supply potentials.

Because planes 21 and 22 completely surround integrated circuit 11, the circuit designer is free to place power supply and ground connector pads where required about the periphery of integrated circuit 11 with reduced concern as to how to route the required potentials to the pads. Note also that two concentric planes 21 and 22 are illustrated for convenience. Though two concentric planes are a common embodiment, three, four, or more planes are possible, allowing the circuit designer additional flexibility as to the distribution of power and ground potentials. In each case, every lead 14 sees the same electrical field from planes 21 and 22, resulting in consistent shielding for each lead 14. Planes 21 and 22 also provide convenient attachment for bypass capacitors.

Figure 2:
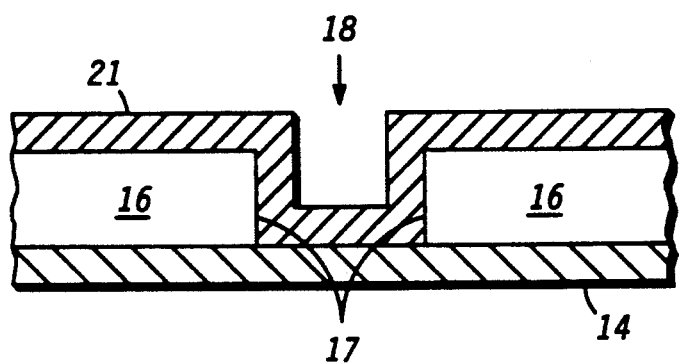
FIG. 2 is a cross sectional view of a typical electrical connection between a power/ground plane and a lead as found in the present invention.

Electrical connection between power/ground planes 21 and 22 and integrated circuit 11 is provided by vias 17 in dielectric layer 16 through which power/ground planes 21 and 22 contact selected ones of leads 14, which then connect, as above, to connector pads 13 on integrated circuit 11. A detail of the electrical connection between plane 21 and leads 14 is provided in FIG. 2. Into planes 21 and 22 are formed depressions 18 which extend through vias 17 in dielectric layer 16, making electrical contact with leads 14. Note in FIG. 1 that connections to leads 14 through vias 17 can be located at any point about the periphery of integrated circuit 11 as required by a given application.

By now it should be apparent that an improved multiple power/ground lead frame for TAB processing has been provided. Concentric power/ground planes provide shielding to the leads of the lead frame, while providing for even power distribution about the integrated circuit bonded to the TAB lead frame. This even power distribution allows flexibility in system design, as well as providing a consistent shielding environment to each lead of the lead frame. The concentric plane design provides structural strength to the lead frame.

I claim:

1. A tape automated bonding lead frame having concentric power/ground planes, comprising:
 a plurality of electrically conductive leads lying in a common plane which are tape automated bonded to a plurality of connecting pads of an integrated circuit, the plurality of electrically conductive leads extending in a radial pattern from a central location;
 an electrically conductive plane divided into a plurality of concentric power/ground planes, each one of the plurality of concentric power/ground planes being electrically isolated from each other one of the plurality of concentric power/ground planes; and
 a dielectric layer which electrically isolates the plurality of concentric power/ground planes from the plurality of electrically conductive leads, wherein the concentric power/ground planes provide shielding to the plurality of electrically conductive leads.

2. The lead frame of claim 1 wherein the dielectric layer provides substantially uniform spacing between the plurality of concentric power/ground planes and the plurality of electrically conductive leads.

3. The lead frame of claim 1 wherein each one of the plurality of concentric power/ground planes is electrically connected to at least one of the plurality of electrically conductive leads through holes in the dielectric layer, providing a connection from each one of the plurality of concentric power/ground planes to at least one of the plurality of connecting pads of the integrated circuit.

4. A power/ground plane assembly comprising:
 a semiconductor device having a plurality of connecting pads which provide input and output to the semiconductor device;
 a plurality of electrically conductive leads making electrical connection to the plurality of connecting pads by tape automated bonding, the plurality of electrically conductive leads lying in a common plane and extending radially from a central location; and
 a power/ground plane located substantially parallel to the plane of the plurality of electrically conductive leads, the power/ground plane being divided into multiple concentric planes, the concentric planes being electrically isolated from one another and from the plurality of electrically conductive leads and providing electromagnetic shielding to the plurality of electrically conductive leads which are bonded to the connecting pads of the semiconductor device.

5. The power/ground plane assembly of claim 4 wherein the multiple concentric planes allow multiple power and ground potentials to be propagated uniformly about the periphery of the semiconductor device, connection from the multiple power and ground potentials to the semiconductor device being provided as required by making electrical contact between the multiple concentric planes and selected ones of the plurality of electrically conductive leads.

* * * * *